United States Patent
Fujino

(10) Patent No.: US 12,224,313 B2
(45) Date of Patent: Feb. 11, 2025

(54) SEMICONDUCTOR DEVICE AND METHOD FOR MANUFACTURING THE SAME

(71) Applicants: Kabushiki Kaisha Toshiba, Tokyo (JP); Toshiba Electronic Devices & Storage Corporation, Tokyo (JP)

(72) Inventor: Yuhki Fujino, Kanazawa Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 18/197,600

(22) Filed: May 15, 2023

(65) Prior Publication Data

US 2023/0290820 A1    Sep. 14, 2023

Related U.S. Application Data

(63) Continuation of application No. 17/198,334, filed on Mar. 11, 2021, now Pat. No. 11,688,765.

(30) Foreign Application Priority Data

Sep. 11, 2020  (JP) .................................. 2020-153233

(51) Int. Cl.
*H01L 29/06*  (2006.01)
*H01L 29/66*  (2006.01)
*H01L 29/78*  (2006.01)

(52) U.S. Cl.
CPC ...... *H01L 29/0653* (2013.01); *H01L 29/0623* (2013.01); *H01L 29/0696* (2013.01);
(Continued)

(58) Field of Classification Search
CPC ............ H01L 29/0653; H01L 29/0623; H01L 29/0696; H01L 29/66712; H01L 29/7802;
(Continued)

(56) References Cited

U.S. PATENT DOCUMENTS 7,859,052 B2* 12/2010 Saito ................... H01L 29/0878
257/341
9,209,249 B2  12/2015 Kachi
(Continued)

FOREIGN PATENT DOCUMENTS

JP    2002-124675 A    4/2002
JP    2002-164540 A    6/2002
(Continued)

OTHER PUBLICATIONS

S. G. Kim et al., "A Novel Super-junction Trench Gate MOSFET Fabricated Using High Aspect-ratio Trench Etching and Boron Lateral Diffusioin Technologies," Proceedings of the 25th International Symposium on Power Semiconductor Devices & ICs, Kanazawa, ISPSD 2013, p. 233-236.

*Primary Examiner* — Cuong B Nguyen
(74) *Attorney, Agent, or Firm* — Knobbe, Martens, Olson & Bear, LLP

(57) ABSTRACT

According to one embodiment, a semiconductor device includes first and second electrodes, first to fifth semiconductor regions, and a gate electrode. The first semiconductor region is provided on the first electrode, and electrically connected to the first electrode. The second semiconductor region is provided on a part of the first semiconductor region. The third semiconductor region is provided on another part of the first semiconductor region. The third semiconductor region includes first and second regions. The fourth semiconductor region is provided on the second semiconductor region. The fifth semiconductor region is provided on a part of the fourth semiconductor region. The gate electrode faces the fourth semiconductor region with a gate insulating layer interposed between the gate electrode and the fourth semiconductor region. The second electrode is provided on the fourth and fifth semiconductor regions.

(Continued)

The second electrode is electrically connected to the fourth and fifth semiconductor regions.

12 Claims, 14 Drawing Sheets

(52) U.S. Cl.
CPC .... *H01L 29/66712* (2013.01); *H01L 29/7802* (2013.01); *H01L 29/7813* (2013.01)

(58) Field of Classification Search
CPC ............ H01L 29/7813; H01L 29/0649; H01L 29/0878; H01L 29/1095; H01L 29/7811; H01L 29/0684
See application file for complete search history.

(56) References Cited

U.S. PATENT DOCUMENTS

| | | |
|---|---|---|
| 10,381,435 B2 | 8/2019 | Nagase et al. |
| 2002/0063259 A1 | 5/2002 | Usui et al. |
| 2002/0185705 A1 | 12/2002 | Saitoh et al. |
| 2004/0012038 A1 | 1/2004 | Kouzuki et al. |
| 2005/0006699 A1 | 1/2005 | Sato et al. |
| 2006/0124997 A1 | 6/2006 | Yamauchi et al. |
| 2007/0272977 A1 | 11/2007 | Saito et al. |
| 2008/0211020 A1 | 9/2008 | Saito |
| 2008/0315297 A1 | 12/2008 | Takashita et al. |
| 2018/0019160 A1 | 1/2018 | Kachi et al. |

FOREIGN PATENT DOCUMENTS

| | | |
|---|---|---|
| JP | 2002-368216 A | 12/2002 |
| JP | 2003-309261 A | 10/2003 |
| JP | 2004-342660 A | 12/2004 |
| JP | 2007-235080 A | 9/2007 |
| JP | 2008-182054 A | 8/2008 |
| JP | 2009-004668 A | 1/2009 |
| JP | 4940546 B2 | 5/2012 |
| JP | 5052025 B2 | 10/2012 |
| JP | 2014-154596 A | 8/2014 |
| JP | 2018-010983 A | 1/2018 |
| JP | 2018-207031 A | 12/2018 |

\* cited by examiner

SEMICONDUCTOR DEVICE AND METHOD FOR MANUFACTURING THE SAME

CROSS-REFERENCE TO RELATED APPLICATIONS

This application is based upon U.S. application Ser. No. 17/198,334 filed on Mar. 11, 2021 which claims the benefit of priority from Japanese Patent Application No. 2020-153233, filed on Sep. 11, 2020; the entire contents of which are incorporated herein by reference.

FIELD

Embodiments described herein relate generally to a semiconductor device and a method for manufacturing the same.

BACKGROUND

A semiconductor device such as a metal-oxide-semiconductor field-effect transistor (MOSFET) is used for power conversion or the like. It is desirable to be high for reliability of the semiconductor device.

DETAILED DESCRIPTION

Figure 1:
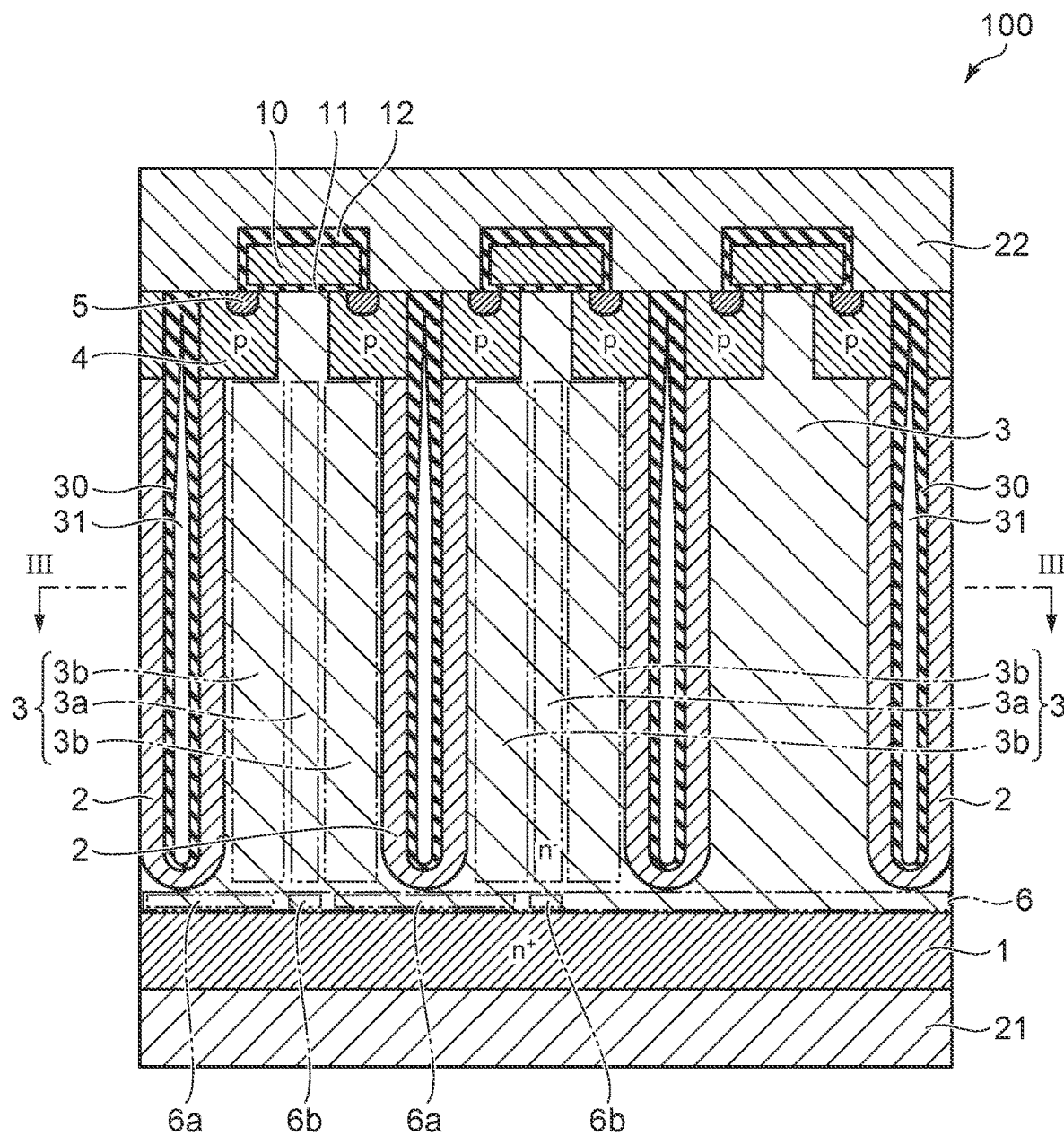
FIG. 1 is a cross-sectional view illustrating a semiconductor device according to the first embodiment.

According to one embodiment, a semiconductor device includes a first electrode, a first semiconductor region of a first conductivity type, a second semiconductor region of a second conductivity type, a third semiconductor region of the first conductivity type, a fourth semiconductor region of the second conductivity type, a fifth semiconductor region of the first conductivity type, a gate electrode, and a second electrode. The first semiconductor region is provided on the first electrode, and electrically connected to the first electrode. The second semiconductor region is provided on a part of the first semiconductor region. The third semiconductor region is provided on another part of the first semiconductor region. The third semiconductor region includes a first region separated from the second semiconductor region in a second direction perpendicular to a first direction directed from the first electrode to the first semiconductor region, and a second region provided between the first region and the second semiconductor region. An impurity concentration of the first conductivity type in the second region is higher than an impurity concentration of the first conductivity type in the first region. The fourth semiconductor region is provided on the second semiconductor region. An impurity concentration of the second conductivity type in the fourth semiconductor region is higher than an impurity concentration of the second conductivity type in the second semiconductor region. The fifth semiconductor region is provided on a part of the fourth semiconductor region. The gate electrode faces the fourth semiconductor region with a gate insulating layer interposed between the gate electrode and the fourth semiconductor region. The second electrode is provided on the fourth semiconductor region and the fifth semiconductor region. The second electrode is electrically connected to the fourth semiconductor region and the fifth semiconductor region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, $n^-$ and $p^+$, p represent relative high and low concentration of impurities. That is, the notation with "+" shows that the impurity concentration is relatively higher than the concentration of the notation without any of "+" and "−", and the notation with "−" shows that the impurity concentration is relatively lower than the concentration of the notation without any of them. These notations represent relative high and low concentration of net impurities after compensation of the impurities, when both of p-type impurity and n-type impurity are included in respective regions.

In the embodiments described later, the embodiments may be executed by inverting the p-type and the n-type in respective semiconductor regions.

First Embodiment

FIG. 1 is a cross-sectional view illustrating a semiconductor device according to the first embodiment.

A semiconductor device 100 according to the first embodiment is a MOSFET. As illustrated in FIG. 1, the semiconductor device 100 includes an $n^+$-type (first conductivity type) drain region 1 (first conductivity region), a p⁻-type (second conductivity type) pillar region 2 (second conductivity region), an n⁻-type pillar region 3 (third semiconductor region), a p-type base region 4 (fourth semiconductor region), an n⁺-type source region 5 (fifth semiconductor region), an n⁻-type buffer region 6 (intermediate region), a gate electrode 10, a drain electrode 21 (first electrode), a source electrode 22 (second electrode), and an insulating part 30.

An XYZ coordinate system is employed in the description of the embodiment. A direction directed from the drain electrode 21 to the n⁺-type drain region 1 is Z-direction (first direction). A direction that is perpendicular to Z-direction is X-direction (second direction). A direction that is perpendicular to Z-direction and intersects X-direction is Y-direction (third direction). Further, for description, a direction directed from the drain electrode 21 to the n⁺-type drain region 1 is referred to as "upper" and an opposite direction thereof is referred to as "lower". These directions are based on the relative positional relationship between the drain electrode 21 and the n⁺-type drain region 1, and thus have no relationship with the direction of gravity.

The drain electrode 21 is provided on the lower surface of the semiconductor device 100. The n⁺-type drain region 1 is provided on the drain electrode 21 and is electrically connected to the drain electrode 21. The p⁻-type pillar region 2 is provided on a part of the n⁺-type drain region 1. The n⁻-type pillar region 3 is provided on another part of the n⁺-type drain region 1. The n⁻-type pillar region 3 is arranged in X-direction with the p⁻-type pillar region 2. The n-type impurity concentration in the n⁻-type pillar region 3 is lower than the n-type impurity concentration in the n⁺-type drain region 1.

The n⁻-type pillar region 3 includes a first region 3a and a second region 3b. The first region 3a is separated from the p⁻-type pillar region 2 in X-direction. The second region 3b is provided between the p⁻-type pillar region 2 and the first region 3a. The n-type impurity concentration in the second region 3b is higher than the n-type impurity concentration in the first region 3a.

The p-type base region 4 is provided on at least a part of the p⁻-type pillar region 2 and the second region 3b. The p-type impurity concentration in the p-type base region 4 is higher than the p-type impurity concentration in the p⁻-type pillar region 2. The n⁺-type source region 5 is provided in an upper part of the p-type base region 4. The gate electrode 10 faces the p-type base region 4 with the gate insulating layer 11 interposed therebetween. In the semiconductor device 100, the gate electrode 10 is provided on the n⁻-type pillar region 3, the p-type base region 4, and the n⁺-type source region 5 with the gate insulating layer 11 interposed therebetween.

The source electrode 22 is provided on the p-type base region 4, the n⁺-type source region 5, and the gate electrode 10, and is electrically connected to the p-type base region 4 and the n⁺-type source region 5. The insulating layer 12 is provided between the gate electrode 10 and the source electrode 22. The source electrode 22 is electrically separated from the gate electrode 10 by the insulating layer 12.

The n⁻-type buffer region 6 is provided between the n⁺-type drain region 1 and the p⁻-type pillar region 2, and between the n⁻-type drain region 1 and the n⁻-type pillar region 3. The n-type impurity concentration in the n⁻-type buffer region 6 is lower than the n-type impurity concentration in the n⁺-type drain region 1. The n⁻-type buffer region 6 includes a first portion 6a and a second portion 6b. The first portion 6a is provided between the n⁺-type drain region 1 and the p⁻-type pillar region 2, and between the n⁻-type drain region 1 and the second region 3b. The second portion 6b is provided between the n⁺-type drain region 1 and the first region 3a.

The insulating part 30 is provided on the n⁺-type drain region 1. The p⁻-type pillar region 2 is provided around the insulating part 30 in X-direction and under the insulating part 30. For example, an upper portion of the insulating part 30 is arranged in X-direction with the p-type base region 4 and in contact with the source electrode 22. As illustrated in FIG. 1, the insulating part 30 may include a gap 31.

Figure 2:
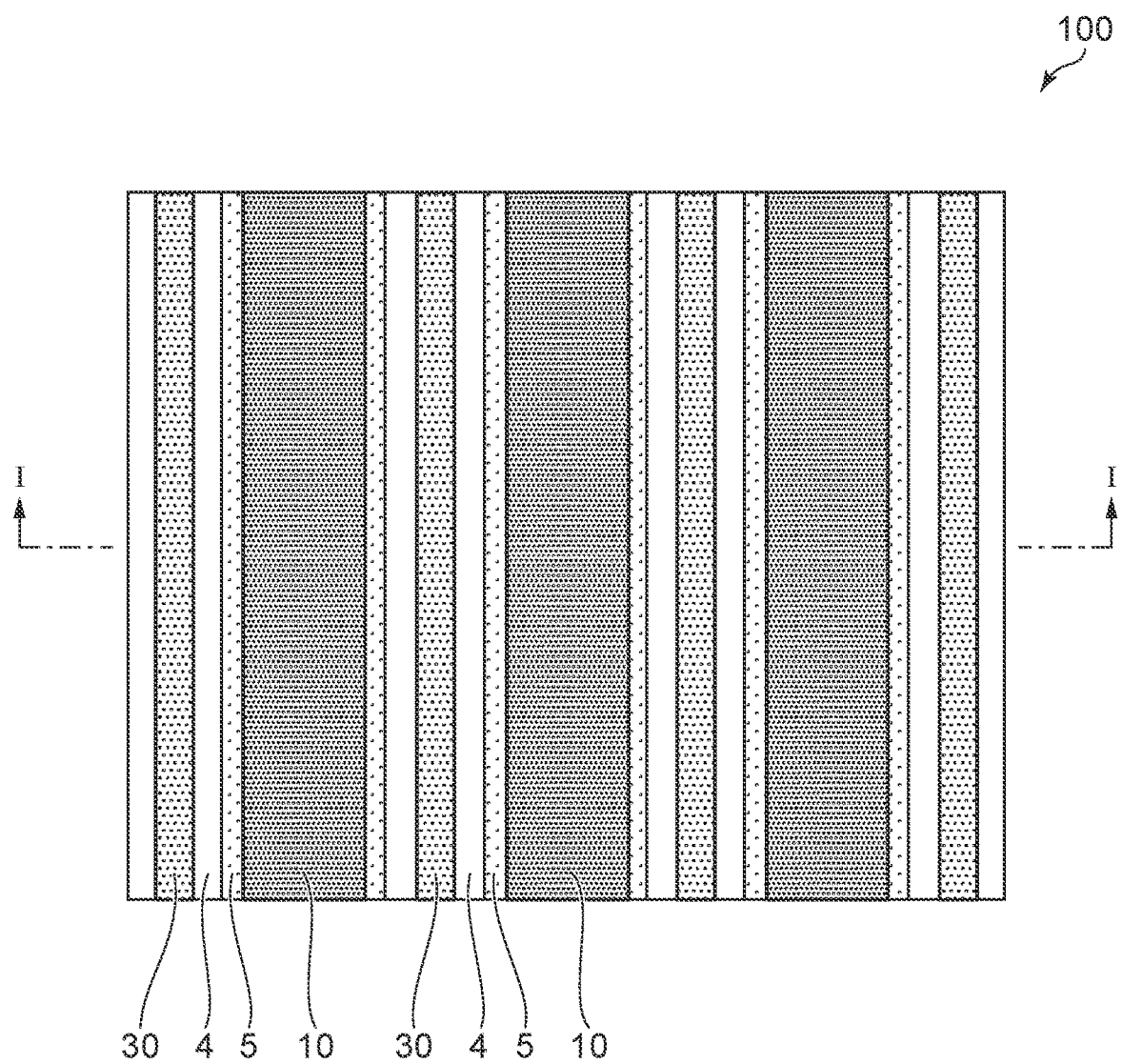
FIG. 2 is a plan view illustrating a semiconductor device according to the first embodiment.

FIG. 2 is a plan view illustrating a semiconductor device according to the first embodiment.

Figure 3:
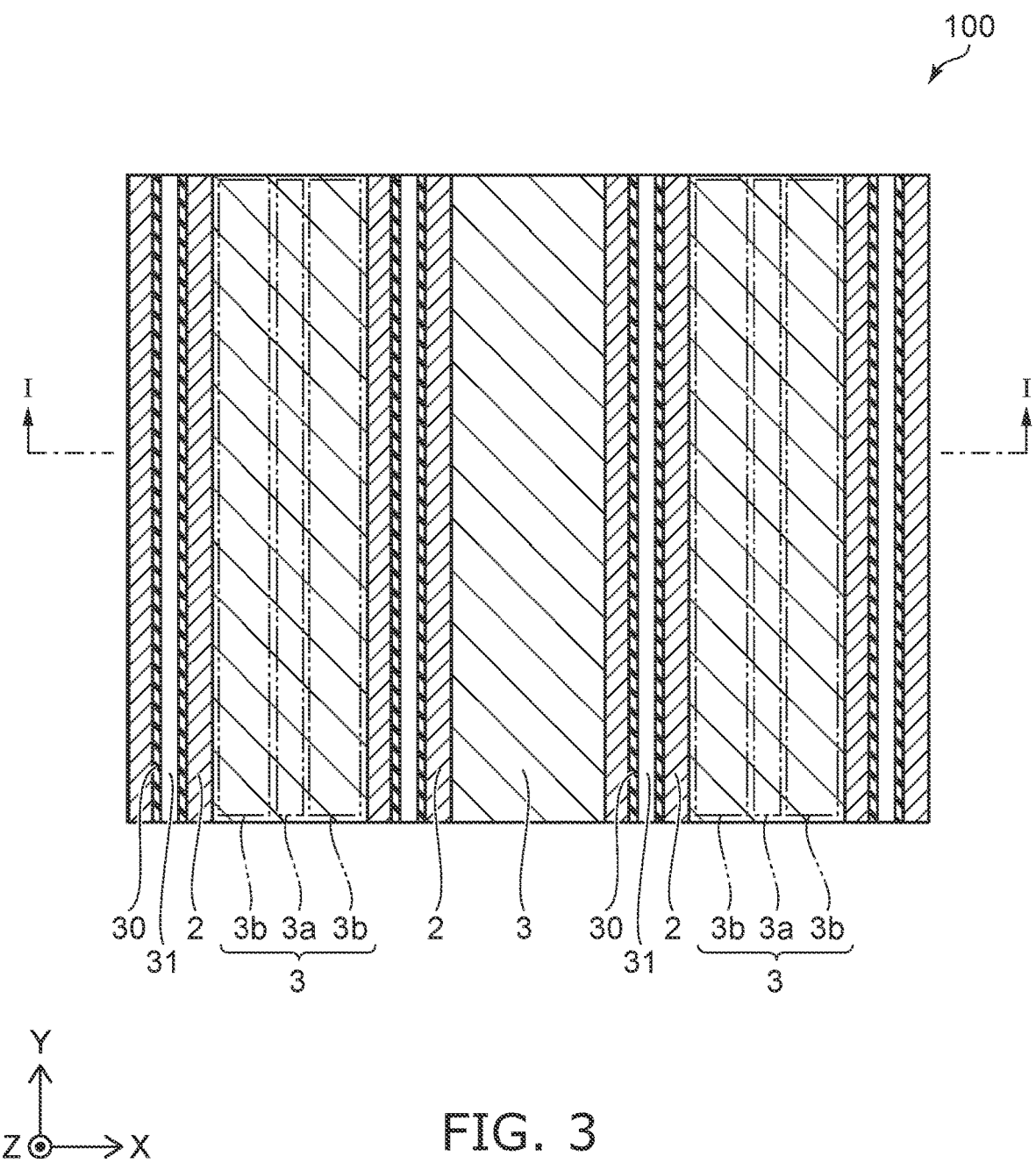
FIG. 3 is a cross-sectional view illustrating a semiconductor device according to the first embodiment.

FIG. 3 is a cross-sectional view illustrating a semiconductor device according to the first embodiment.

FIG. 1 is a cross-sectional view taken along the line I-I in FIGS. 2 and 3. FIG. 3 is a cross-sectional view taken along the line III-III in FIG. 1. In FIG. 2, the insulating layer 12 and the source electrode 22 are omitted.

For example, as illustrated in FIGS. 1 to 3, a plurality of p⁻-type pillar regions 2, n⁻-type pillar regions 3, p-type base regions 4, n⁺-type source regions 5, gate electrodes 10, and insulating parts 30 are provided in X-direction. A plurality of p⁻-type pillar regions 2 and a plurality of n⁻-type pillar regions 3 are alternately provided in X-direction. One n⁻-type pillar region 3 includes one first region 3a and two second regions 3b. The two second regions 3b are respectively provided between the first region 3a and two p⁻-type pillar regions 2 which are adjacent to each other in X direction. The first region 3a includes an intermediate portion between the p⁻-type pillar regions 2 which are adjacent to each other in X-direction.

Two p-type base regions 4 are provided on one p⁻-type pillar region 2. The upper portion of the insulating part 30 is provided between two p-type base regions 4 in X-direction. The n⁺-type source region 5 is provided on each p-type base region 4. Two p-type base regions 4 and two n⁺-type source regions 5 are provided between two insulating parts 30 which are adjacent to each other in X direction X. The gate electrode 10 is provided on the n⁻-type pillar region 3, two p-type base regions 4, and two n⁻-type source regions 5 with the gate insulating layer 11 interposed therebetween. The p⁻-type pillar regions 2, the n⁻-type pillar regions 3, the p-type base regions 4, the n⁺-type source regions 5, the gate electrodes 10, and the insulating parts 30 extend along Y-direction. In examples illustrated in FIGS. 1 to 3, Y direction is perpendicular to X direction.

Operations of the semiconductor device 100 will be described.

A voltage higher than a threshold is applied to the gate electrode 10 in a state in which a voltage positive with respect to the source electrode 22 is applied to the drain electrode 21. A channel (inversion layer) is formed in the p-type base region 4. This brings the semiconductor device 100 into an on-state. In an on-state, electrons flow into the drain electrode 21 via the channel and the n⁻-type pillar region 3. Thereafter, when the voltage applied to the gate electrode 10 becomes lower than the threshold, the channel in the p-type base region 4 disappears, so that the semiconductor device 100 is brought into an off-state. When the semiconductor device 100 is in an off-state, a depletion layer extends from the p-n junction surface between the n⁻-type pillar region 3 and the p-type base region 4 along Z direction, and a depletion layer extends from the p-n junction surface between the n⁻-type pillar region 3 and the p⁻-type pillar region 2 along X direction.

An example of the material of each constituent element of the semiconductor device 100 will be described.

The $n^+$-type drain region 1, the $p^-$-type pillar region 2, the $n^-$-type pillar region 3, the p-type base region 4, the $n^+$-type source region 5, and the $n^-$-type buffer region 6 contain, as a semiconductor material, silicon, silicon carbide, gallium nitride, or gallium arsenide. In a case where silicon is used as a semiconductor material, arsenic, phosphorus, or antimony can be used as the n-type impurity. Boron can be used as the p-type impurity. The gate electrode 10 contains a conductive material such as polysilicon. The gate insulating layer 11 and the insulating part 30 contain an insulating material such as silicon oxide. The drain electrode 21 and the source electrode 22 contain a metal such as titanium, tungsten, or aluminum.

FIGS. 4A to 6B are cross-sectional views illustrating a manufacturing process of a semiconductor device according to the first embodiment.

Figure 4A:
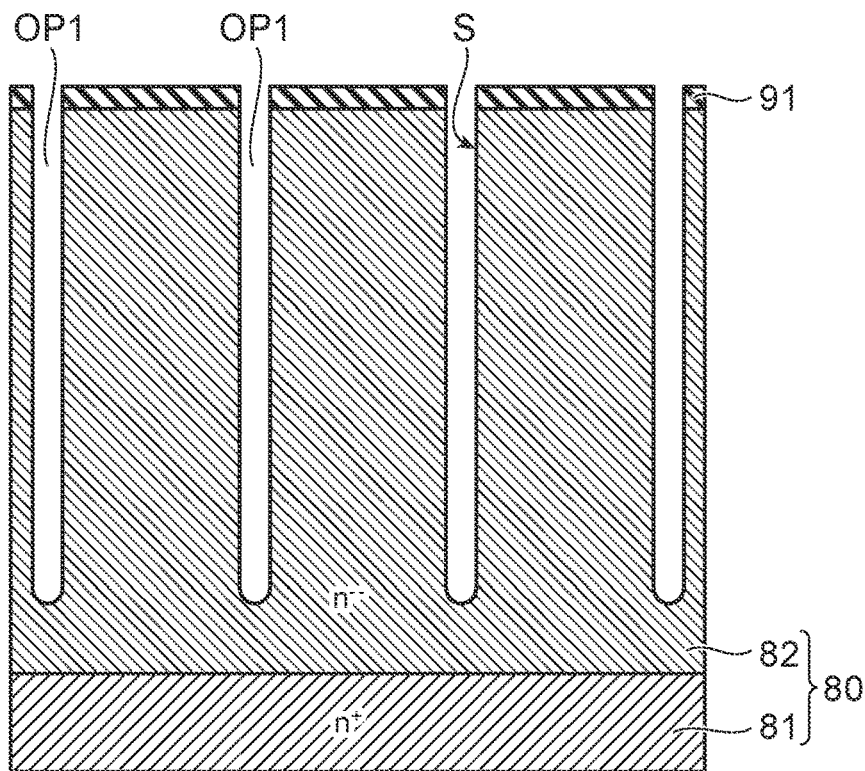
FIGS. 4A and 4B are cross-sectional views illustrating a manufacturing process of a semiconductor device according to the first embodiment.

First, a semiconductor substrate 80 including an $n^+$-type semiconductor layer 81 (first semiconductor layer) and an $n^-$-type semiconductor layer 82 (second semiconductor layer) is prepared. The $n^-$-type semiconductor layer 82 is provided on the $n^+$-type semiconductor layer 81. An insulating layer 91 is formed on the $n^-$-type semiconductor layer 82 by chemical vapor deposition (CVD). The insulating layer 91 is patterned by photolithography and reactive ion etching (RIE). An opening OP1 is formed in the upper surface of the $n^-$-type semiconductor layer 82 by RIE using the insulating layer 91 as a mask. As illustrated in FIG. 4A, a plurality of openings OP1 are formed in X-direction. Each opening OP1 extends along Y-direction.

Figure 4B:
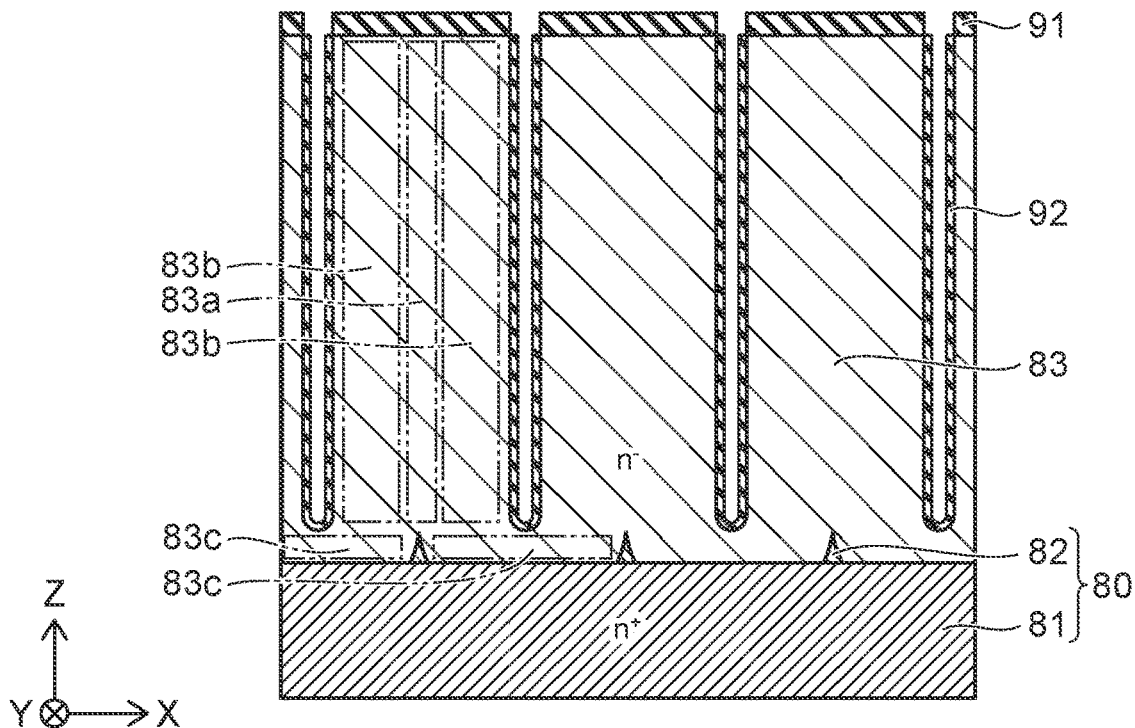

In the structural body illustrated in FIG. 4A, an inner surface S of the opening OP1 is doped with an n-type impurity by an isotropic doping method. The inner surface S is a part of the surface of the $n^-$-type semiconductor layer 82. As the isotropic doping method, plasma doping or solid phase diffusion is employed. The semiconductor substrate 80 is heat-treated to activate the n-type impurity. Thereby, the $n^-$-type diffusion region 83 (first diffusion region) is formed in the $n^-$-type semiconductor layer 82 as illustrated in FIG. 4B. An insulating layer 92 may be formed along the inner surface of the opening OP1 by thermal oxidation before the heat treatment of the semiconductor substrate 80. The insulating layer 92 can suppress vaporization of the semiconductor material of the $n^-$-type semiconductor layer 82 during heat treatment for activation.

The n-type impurity is diffused from the inner surface S of the opening OP1 to X-direction and Y-direction during the heat treatment for activation. A concentration gradient is formed in the $n^-$-type diffusion region 83. As a result, the $n^-$-type diffusion region 83 includes a first region 83a, a second region 83b, and a third region 83c. The first region 83a is separated from the inner surface S in X-direction. The second region 83b is positioned between the inner surface S and the first region 83a. The third region 83c is positioned between the $n^+$-type semiconductor layer 81 and the inner surface S, and between the $n^+$-type semiconductor layer 81 and the second region 83b in Z-direction. The n-type impurity concentration in each of the second region 83b and the third region 83c is higher than the n-type impurity concentration in the first region 83a.

Also, the $n^-$-type semiconductor layer 82 remains under the lower portion of the first region 83a, for example. The n-type impurity concentration in the $n^-$-type semiconductor layer 82 is lower than the n-type impurity concentration in the first region 83a. Alternatively, the n-type impurity may be diffused in the entire $n^-$-type semiconductor layer 82 during the heat treatment for activation. In this case, a fourth region having a concentration of a first conductivity type impurity lower than that of the first region 83a is formed under the first region 83a. In any case, after formation of the $n^-$-type diffusion region 83, a region of a first conductivity type having a concentration of the first conductivity type impurity lower than that of the first region 83a exists under the first region 83a.

Figure 5A:
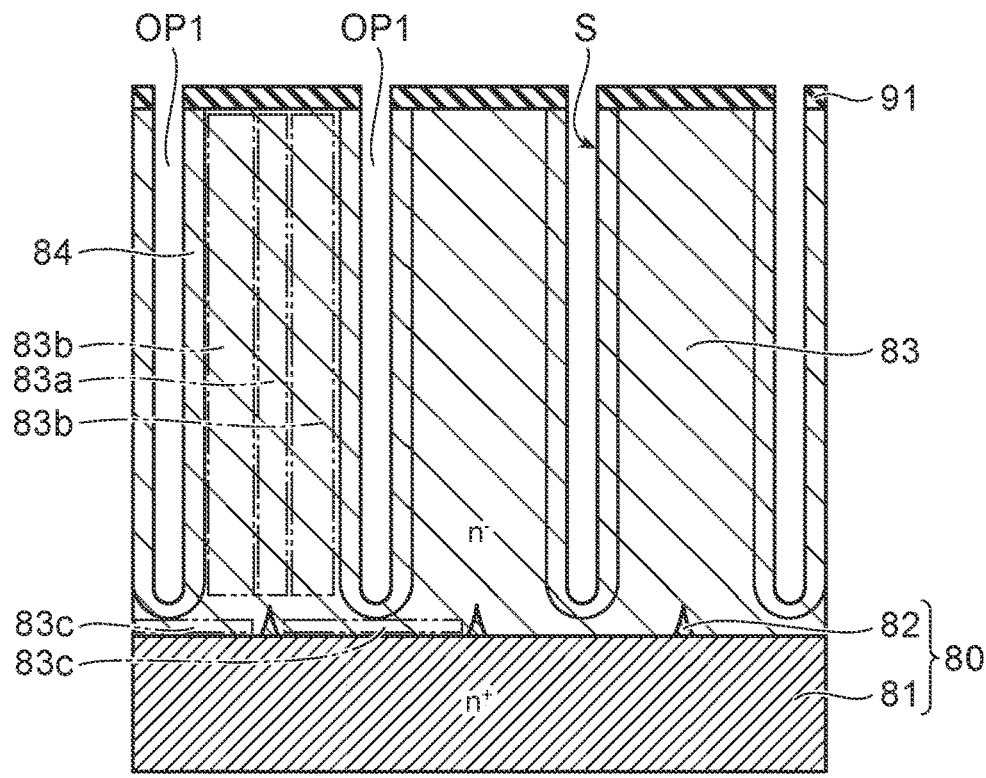
FIGS. 5A and 5B are cross-sectional views illustrating a manufacturing process of a semiconductor device according to the first embodiment.

The insulating layer 92 is removed. The inner surface S is doped with a p-type impurity by plasma doping or solid phase diffusion. The semiconductor substrate 80 is heat-treated to activate the p-type impurity. As illustrated in FIG. 5A, a $p^-$-type diffusion region 84 (second diffusion region) along the inner surface S is formed so as to be stacked on a part of the $n^-$-type diffusion region 83.

Figure 5B:
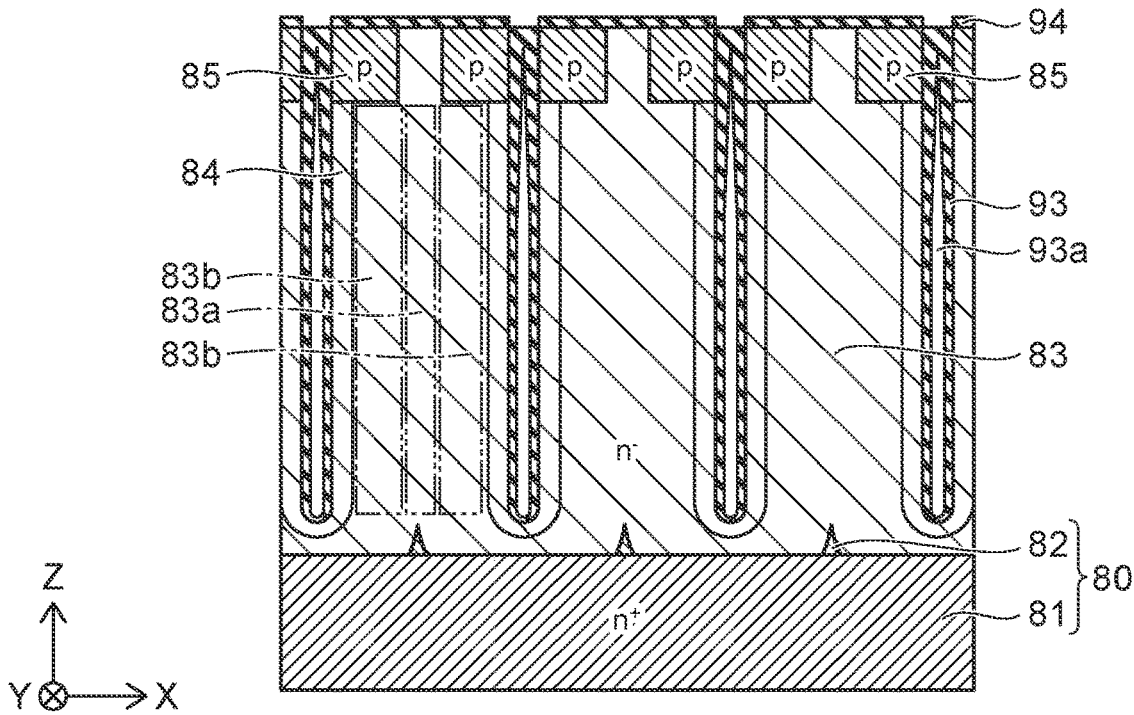

An insulating layer 93 filling the opening OP1 is formed by CVD. A part of the insulating layer 93 and the insulating layer 91 are removed such that the upper surface of the $n^-$-type diffusion region 83 is exposed. A gap 93a may exist in the remaining insulating layer 93. An insulating layer 94 is formed on the upper surface of the $n^-$-type diffusion region 83 and the upper surface of the p-type diffusion region 85 by thermal oxidation. As illustrated in FIG. 5B, a p-type impurity is ion-implanted on an upper portion of the $p^-$-type diffusion region 84 to form the p-type diffusion region 85.

Figure 6A:
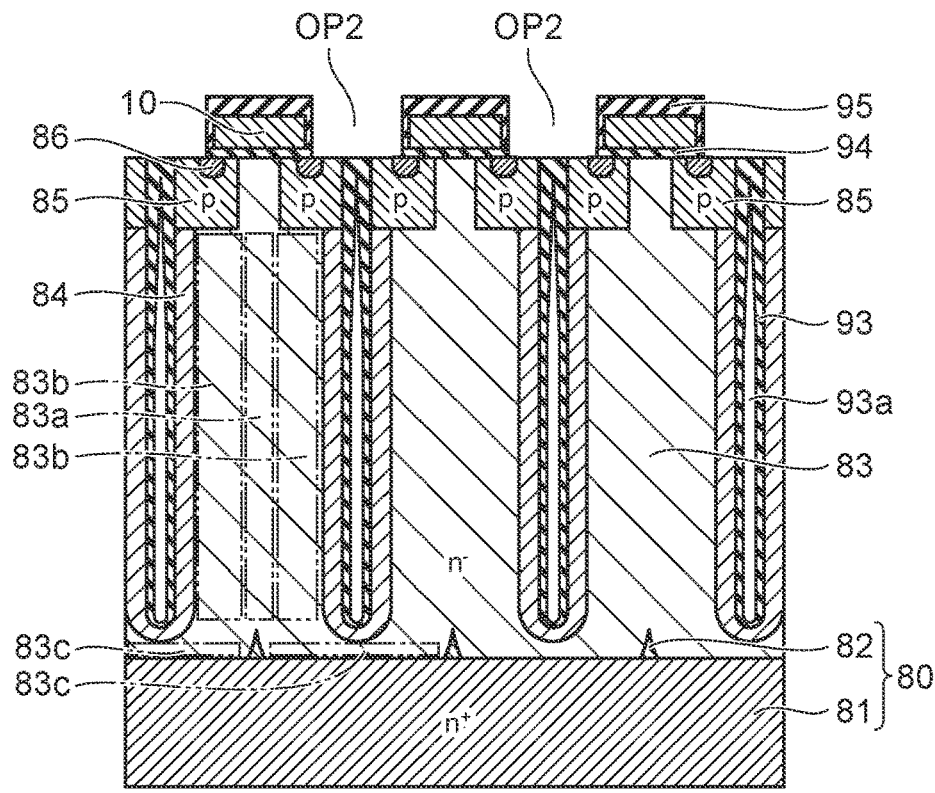
FIGS. 6A and 6B are cross-sectional views illustrating a manufacturing process of a semiconductor device according to the first embodiment.

A conductive layer is formed on the insulating layer 94 and this conductive layer is patterned by photolithography and RIE. As a result, the gate electrode 10 is formed. An insulating layer 95 covering the insulating layer 94 and the gate electrode 10 is formed. A part of the insulating layer 94 and a part of the insulating layer 95 are removed by photolithography and RIE to form an opening OP2 between the gate electrodes 10. The remaining insulating layer 94 and the remaining insulating layer 95 respectively correspond to the gate insulating layer 11 and the insulating layer 12. A part of the p-type base region 4 and the insulating layer 93 are exposed through the opening OP2. An n-type impurity is selectively ion-implanted on an upper portion of the p-type diffusion region 85 through the opening OP2. Thereby, an $n^+$-type diffusion region 86 is formed as illustrated in FIG. 6A.

Figure 6B:
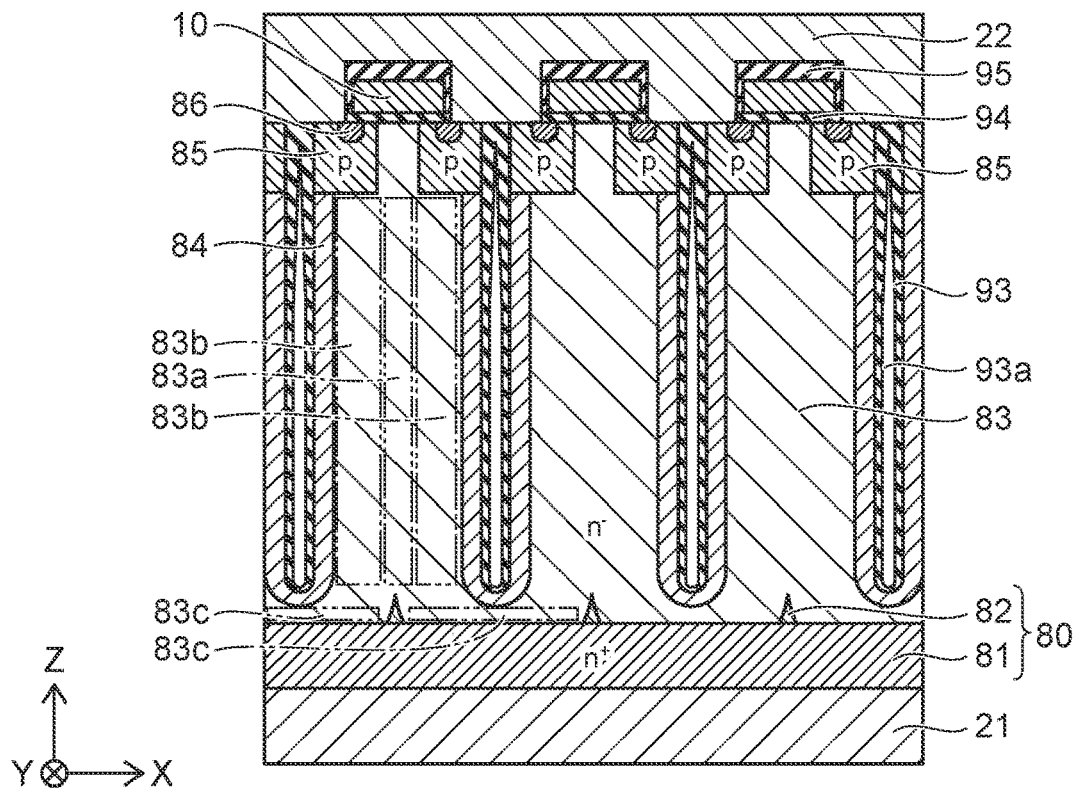

A source electrode 22 filling the opening OP2 is formed on the insulating layer 95. The back surface of the $n^+$-type semiconductor layer 81 is abraded until the thickness of the $n^-$-type semiconductor layer 81 reaches a predetermined thickness. As illustrated in FIG. 6B, the drain electrode 21 is formed on the back surface of the $n^+$-type semiconductor layer 81. Thus, the semiconductor device 100 according to the first embodiment is manufactured.

In the semiconductor device illustrated in FIG. 6B, the $n^-$-type semiconductor layer 81 corresponds to the $n^+$-type drain region 1 in the semiconductor device 100. A part of the $n^-$-type diffusion region 83 between the $p^-$-type diffusion regions 84 which are adjacent to each other in X-direction corresponds to the $n^-$-type pillar region 3. The first region 83a of the $n^-$-type diffusion region 83 corresponds to the first region 3a of the $n^-$-type pillar region 3. The second region 83b of the $n^-$-type diffusion region 83 corresponds to the second region 3b of the $n^-$-type pillar region 3. A region of a first conductivity type between the $n^+$-type semiconductor layer 81 and the $p^-$-type diffusion region 84, between the $n^+$-type semiconductor layer 81 and the first region 83a, and between the $n^+$-type semiconductor layer 81 and the second region 83b corresponds to the $n^-$-type buffer region 6. The third region 83c of the $n^-$-type diffusion region 83 corresponds to the first portion 6a of the $n^-$-type buffer region 6. The $n^-$-type semiconductor layer 82 corresponds to the second portion 6b of the $n^-$-type buffer region 6. The p⁻-type diffusion region 84 corresponds to the p⁻-type pillar region 2. The p-type diffusion region 85 corresponds to the p-type base region 4. The n⁺-type diffusion region 86 corresponds to the n⁺-type source region 5.

The effects of the first embodiment will be described.

To improve the breakdown voltage of the semiconductor device 100, the difference between the amount of the p-type impurity contained in the p⁻-type pillar region 2 and the amount of the n-type impurity contained in the n⁻-type pillar region 3 is preferably small. A small difference between amounts of the impurities allows the p⁻-type pillar region 2 and the n⁻-type pillar region 3 to be completely depleted when the semiconductor device 100 is in an off-state.

In addition to the breakdown voltage, reduction in the on-resistance is desired for the semiconductor device 100. The n-type impurity concentration in the n⁻-type pillar region 3 is preferably high in order to reduce the on-resistance of the semiconductor device 100. However, as the n-type impurity concentration in the n⁻-type pillar region 3 becomes high, the n⁻-type pillar region 3 becomes difficult to be depleted. For this reason, the width of the n⁻-type pillar region 3 (length in X-direction) needs to be reduced as the n-type impurity concentration in the n⁻-type pillar region 3 becomes high. By setting the n-type impurity concentration in the n⁻-type pillar region 3 to be high and reducing the width of the n⁻-type pillar region 3, the on-resistance of the semiconductor device 100 can be reduced while the breakdown voltage of the semiconductor device 100 is maintained.

Meanwhile, with a high n-type impurity concentration in the n⁻-type pillar region 3, when the width of the n⁻-type pillar region 3 varies, variation in the amount of the n-type impurity contained in the n⁻-type pillar region 3 becomes large. As a result, variation in the breakdown voltage of the semiconductor device 100 becomes large, thus reducing the reliability of the semiconductor device 100.

For this problem, in the semiconductor device 100 according to the first embodiment, the n⁻-type pillar region 3 includes the first region 3a and the second region 3b. For example, the width of the n⁻-type semiconductor layer 82 between the openings OP1 which are adjacent to each other in X-direction, illustrated in FIG. 4A affects the width of the n⁻-type pillar region 3. As illustrated in FIG. 4B, the first region 3a and the second region 3b are formed by doping the inner surface S of the opening OP1 with an n-type impurity. The second region 3b is formed along the inner surface S, and the width of the second region 3b is substantially constant regardless of variation in the width of the n⁻-type pillar region 3. For this reason, when the width of the n⁻-type pillar region 3 varies, the width of the first region 3a varies according to the variation.

The n-type impurity concentration in the first region 3a is lower than the n-type impurity concentration in the second region 3b. Thus, even when the width of the first region 3a varies, variation in the amount of the n-type impurity contained in the n⁻-type pillar region 3 is smaller than a case where the width of the second region 3b varies. According to the first embodiment, variation in the amount of the n-type impurity in the n⁻-type pillar region 3 caused by variation in the width of the n⁻-type pillar region 3 can be reduced. As a result, variation in the breakdown voltage of the semiconductor device 100 can be reduced, thus improving the reliability of the semiconductor device 100.

A preferred example of the first embodiment will be described.

Figure 7A:
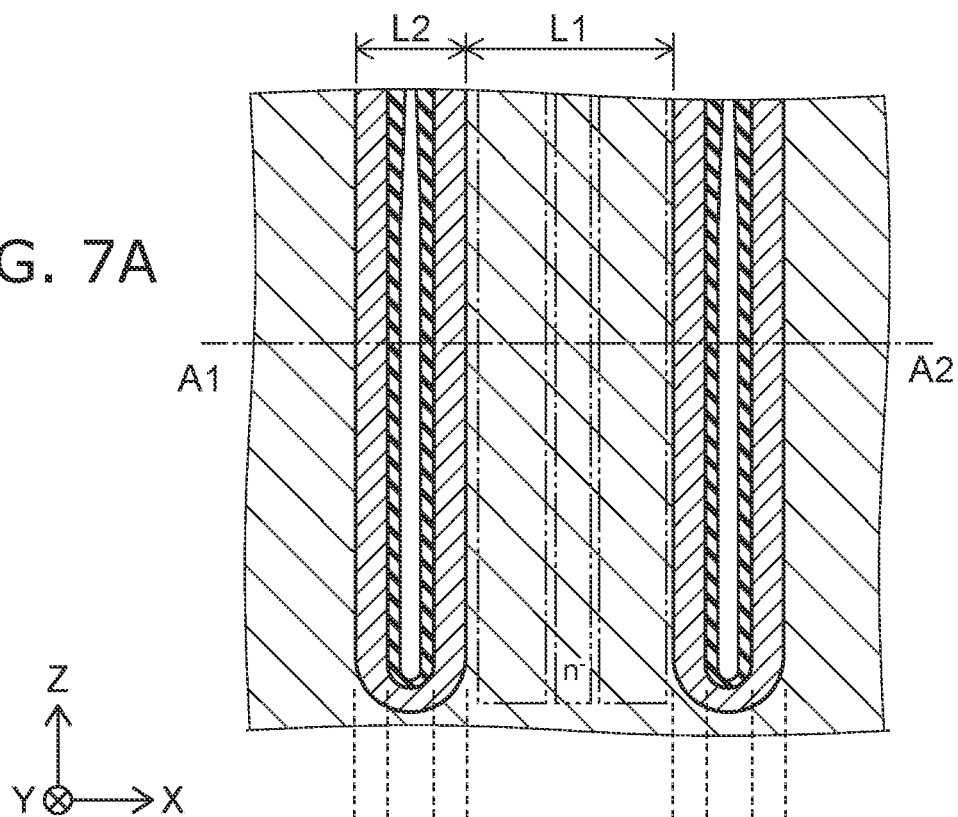
FIG. 7A is a cross-sectional view illustrating a part of a semiconductor device according to the first embodiment.

FIG. 7A is a cross-sectional view illustrating a part of a semiconductor device according to the first embodiment.

Figure 7B:
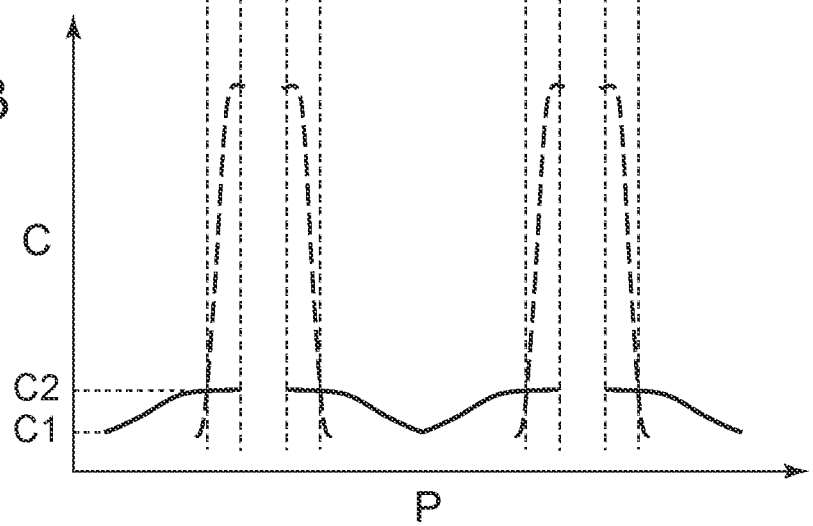
FIG. 7B is a graph showing the impurity concentration in the A1-A2 line in FIG. 7A.

FIG. 7B is a graph showing the impurity concentration in the A1-A2 line in FIG. 7A.

In FIG. 7B, the horizontal axis represents the position P in X-direction. The vertical axis represents the impurity concentration C. The solid line represents the n-type impurity concentration. The dashed line represents the p-type impurity concentration.

As illustrated in FIG. 7A, the length L1 of the n⁻-type pillar region 3 in X-direction is longer than the length L2 of the p⁻-type pillar region 2 in X-direction. As illustrated in FIG. 7B, the p-type impurity concentration in the p⁻-type pillar region 2 is higher than the n-type impurity concentration in the n⁻-type pillar region 3. When the semiconductor device 100 is in an on-state, electrons flow into the drain electrode 21 via the n⁻-type pillar region 3. The length L1 being longer than the length L2 allows the width of the path of electrons to be increased when the semiconductor device 100 is in an on-state. Thereby, the on-resistance of the semiconductor device 100 can be further reduced.

As the n-type impurity concentration in the first region 3a is low, variation in the amount of the n-type impurity of the n⁻-type pillar region 3 caused by variation in the width of the n⁻-type pillar region 3 is small. Therefore, the n-type impurity concentration C1 in the first region 3a is preferably less than 0.5 times the n-type impurity concentration C2 in the second region 3b.

The p⁻-type pillar region 2 is formed by doping the p-type impurity along the inner surface S of the opening OP1 as illustrated in FIG. 5A. The insulating part 30 is provided inside the p⁻-type pillar region 2. As a result, variation in the amount of the p-type impurity contained in the p⁻-type pillar region 2 can be reduced regardless of variation in the width of the opening OP1 compared to a case of filling the opening OP1 with a p-type semiconductor layer.

The p⁻-type pillar region 2 may be provided around a semiconductor part not substantially containing impurities instead of the insulating part 30. Note that, for reducing leak current in the semiconductor device 100, it is preferable to provide the p⁻-type pillar region 2 around the insulating part 30.

Preferably, the insulating part 30 includes the gap 31. In a case where the insulating part 30 is provided, a stress is applied from the insulating part 30 to the p⁻-type pillar region 2 and the n⁻-type pillar region 3. Such a stress may cause cracks in the p⁻-type pillar region 2 or the n⁻-type pillar region 3. In a case where the insulating part 30 includes the gap 31, deformation of the gap 31 causes uneven distribution of the stress applied from the insulating part 30 to the p⁻-type pillar region 2 and the n⁻-type pillar region 3. This enables to reduce a possibility that cracks are generated in the p⁻-type pillar region 2 or the n⁻-type pillar region 3.

The semiconductor device 100 preferably includes the n⁻-type buffer region 6. By providing the n⁻-type buffer region 6, a depletion layer extends between the n⁺-type drain region 1 and the p⁻-type pillar region 2, and between the n⁺-type drain region 1 and the n⁻-type pillar region 3, so that the breakdown voltage of the semiconductor device 100 can be improved.

Further, as illustrated in FIG. 1, the n⁻-type buffer region 6 includes the first portion 6a and the second portion 6b. The second portion 6b is positioned between the n⁺-type drain region 1 and the first region 3a in Z-direction. In other words, the second portion 6b is separated from the p⁻-type pillar region 2 in X-direction and Z-direction. For this reason, when the semiconductor device 100 is in an off-state, the second portion 6b is difficult to deplete compared to the first portion 6a positioned under the p⁻-type pillar region 2. For this problem, the n-type impurity concentration in the second portion 6b is preferably lower than the n-type impurity concentration in the first portion 6a. In this case, the second portion 6b is easily depleted compared to a case where the n-type impurity concentrations in the first portion 6a and the second portion 6b are the same. As a result, the breakdown voltage of the semiconductor device 100 can be improved.

First Modification

Figure 8:
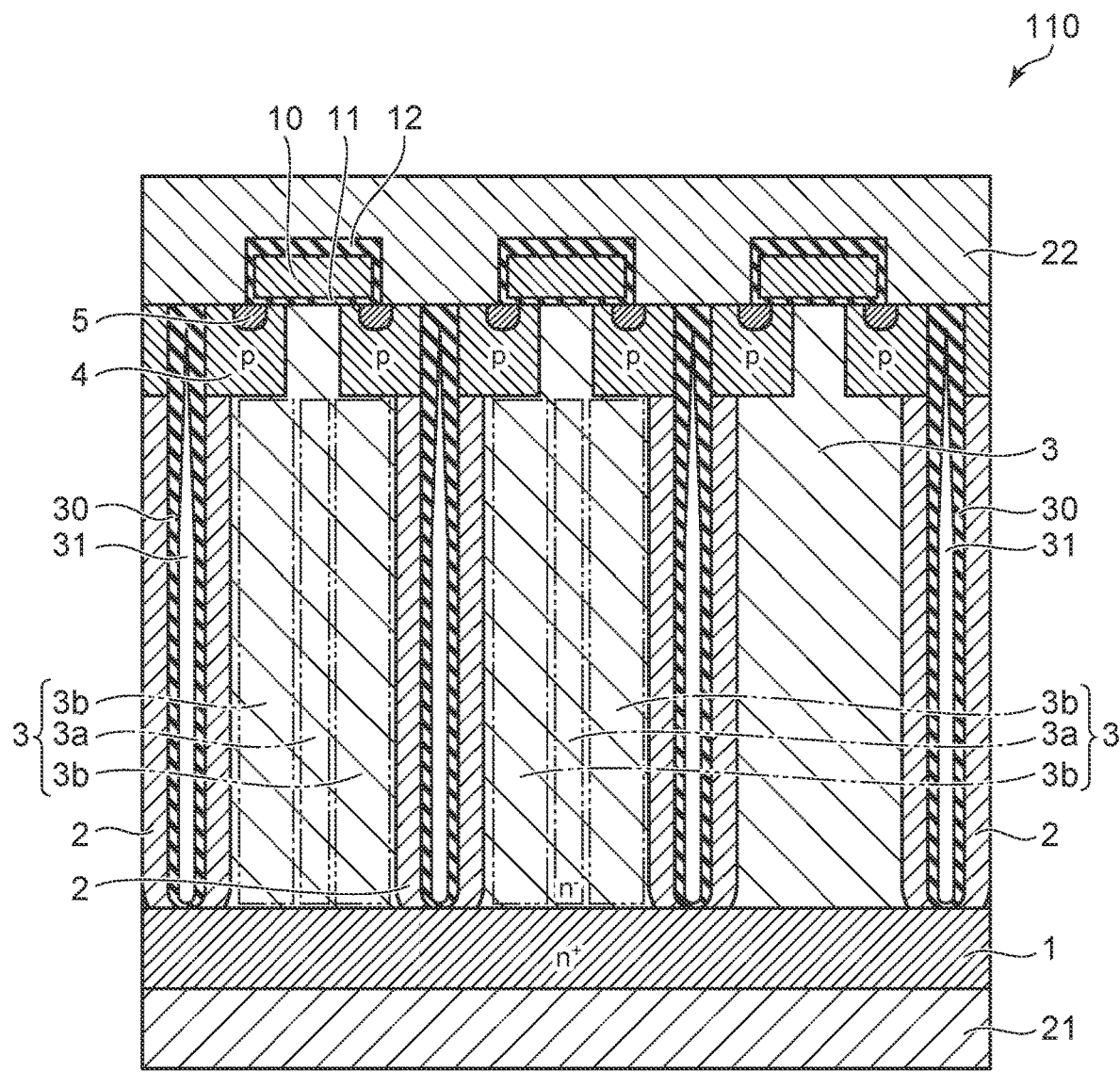
FIG. 8 is a cross-sectional view illustrating a semiconductor device according to the first modification of the first embodiment.

FIG. 8 is a cross-sectional view illustrating a semiconductor device according to the first modification of the first embodiment.

A semiconductor device 110 illustrated in FIG. 8 is different from the semiconductor device 100 in that the semiconductor device 110 does not include the n⁻-type buffer region 6. In the semiconductor device 110, as in the semiconductor device 100, the n⁻-type pillar region 3 includes the first region 3a and the second region 3b. Even in a case where the n⁻-type buffer region 6 is not provided, variation in the amount of the n-type impurity of the n⁻-type pillar region 3 caused by variation in the width of the n⁻-type pillar region 3 can be reduced compared to a case where the n-type impurity concentration in the n⁻-type pillar region 3 is uniform, by providing the first region 3a and the second region 3b.

Second Modification

Figure 9:
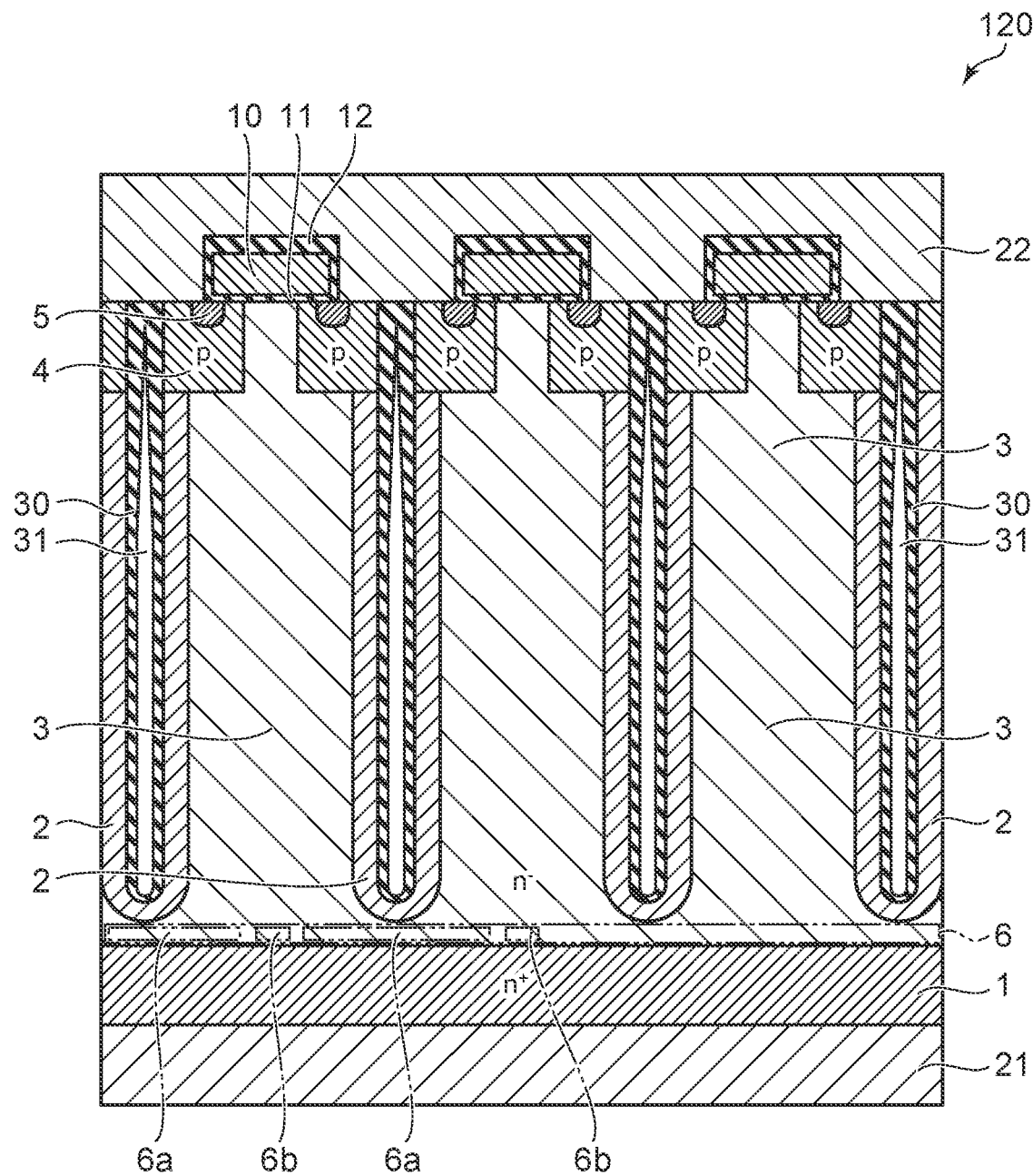
FIG. 9 is a cross-sectional view illustrating a semiconductor device according to the second modification of the first embodiment.

FIG. 9 is a cross-sectional view illustrating a semiconductor device according to the second modification of the first embodiment.

In a semiconductor device 120 illustrated in FIG. 9, variation in the n-type impurity concentration of the n⁻-type pillar region 3 in X-direction is smaller than that of the semiconductor device 100. In the semiconductor device 120, the n-type impurity concentration in the n⁻-type pillar region 3 may be uniform. In the semiconductor device 120, as in the semiconductor device 100, the n⁻-type buffer region 6 includes the first portion 6a and the second portion 6b. Even in a case where variation in the n-type impurity concentration of the n⁻-type pillar region 3 in X-direction is small, the breakdown voltage of the semiconductor device 120 can be improved compared to a case where the n-type impurity concentration in the n⁻-type buffer region 6 is uniform, by providing the first portion 6a and the second portion 6b.

Third Modification

Figure 10:
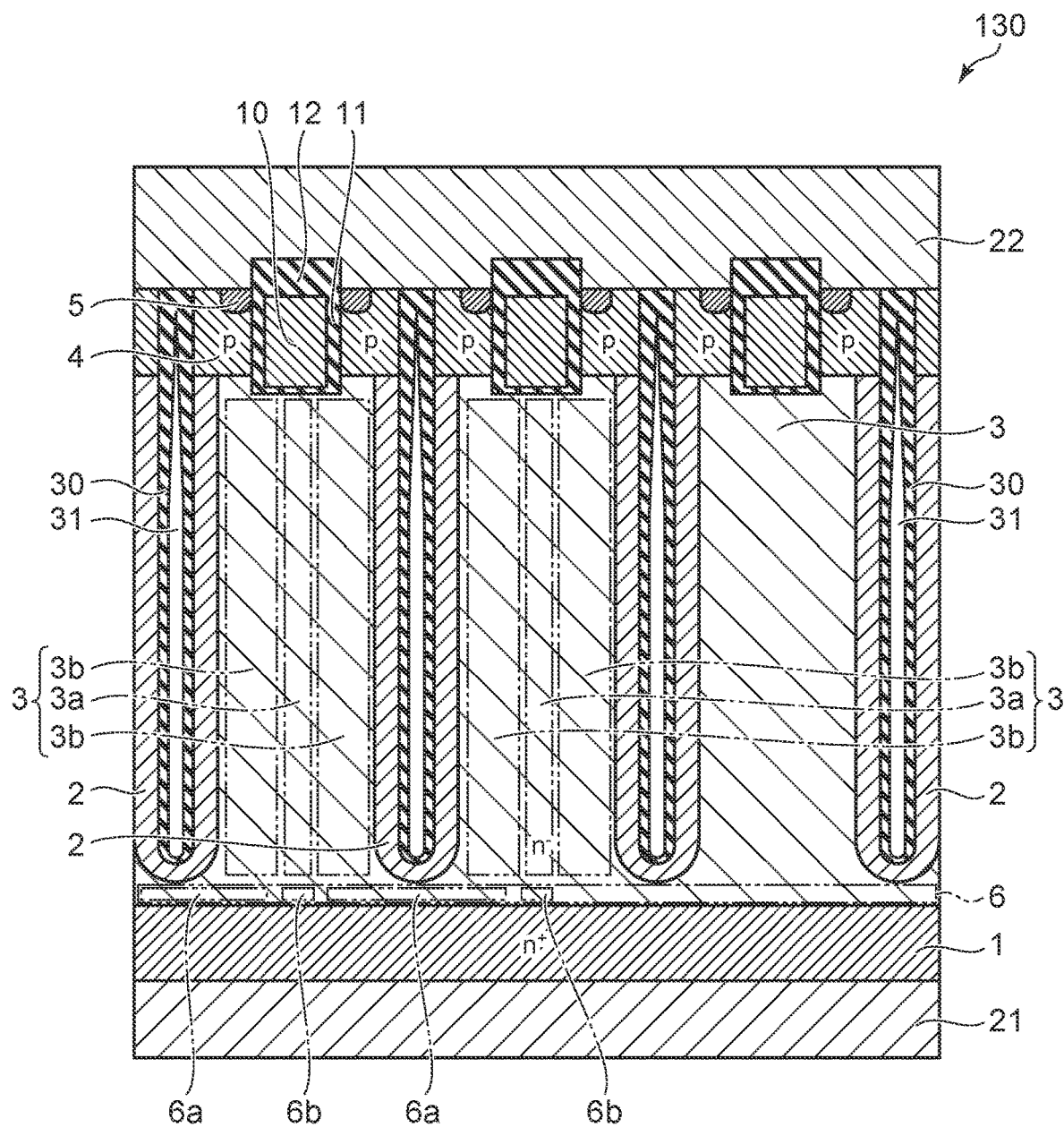
FIG. 10 is a cross-sectional view illustrating a semiconductor device according to the third modification of the first embodiment.

FIG. 10 is a cross-sectional view illustrating a semiconductor device according to the third modification of the first embodiment.

As a semiconductor device 130 illustrated in FIG. 10, the gate electrode 10 may face the p-type base region 4 in X-direction with the gate insulating layer 11 interposed therebetween. The gate electrode 10 is positioned on the first region 3a. In the semiconductor device 130, as in the semiconductor device 100, the n⁻-type pillar region 3 includes the first region 3a and the second region 3b. Thereby, variation in the breakdown voltage of the semiconductor device 130 can be reduced, thus improving the reliability of the semiconductor device 130. Further, the n⁻-type buffer region 6 includes the first portion 6a and the second portion 6b. Thereby, the breakdown voltage of the semiconductor device 130 can be improved.

Second Embodiment

Figure 11:
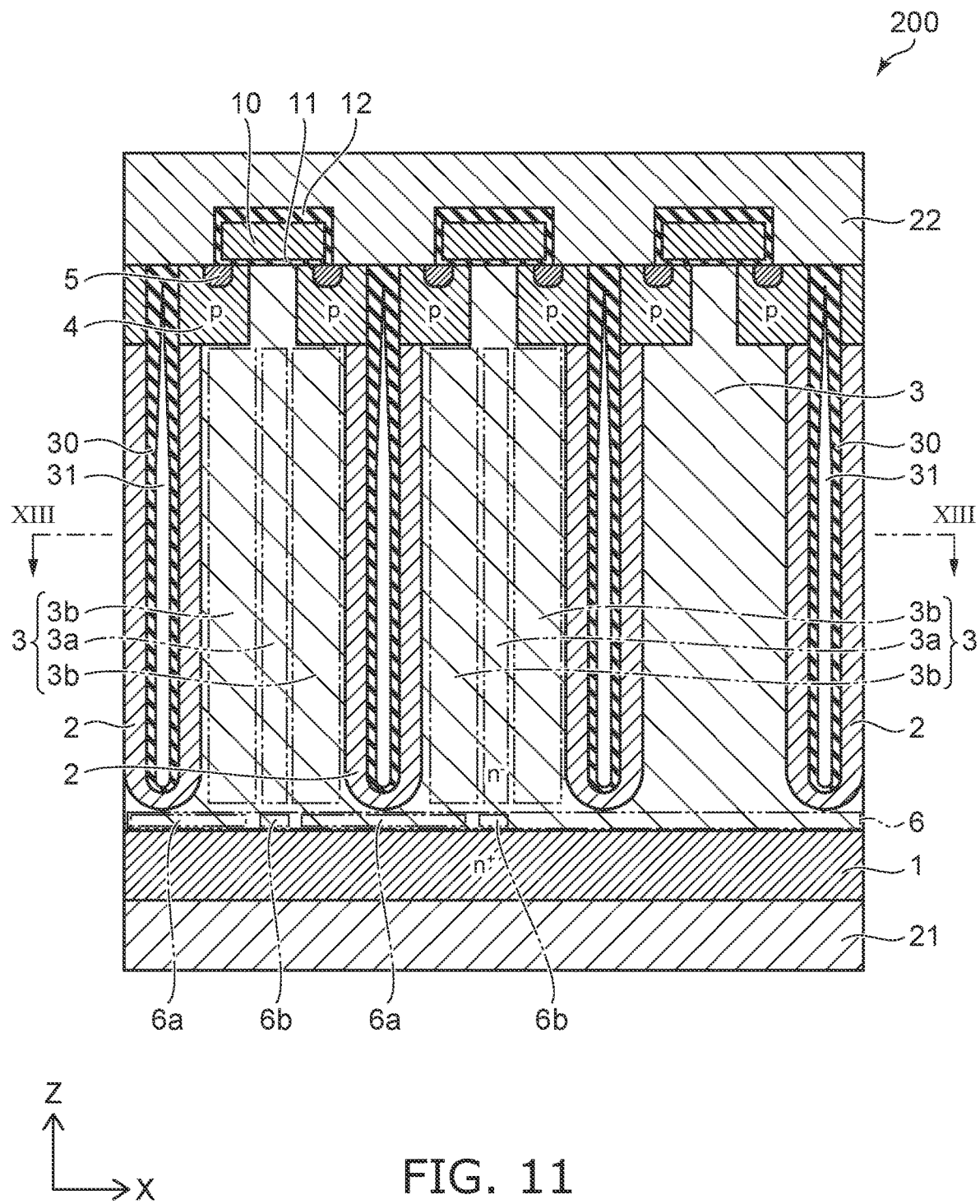
FIG. 11 is a cross-sectional view illustrating a semiconductor device according to the second embodiment.
Figure 13:
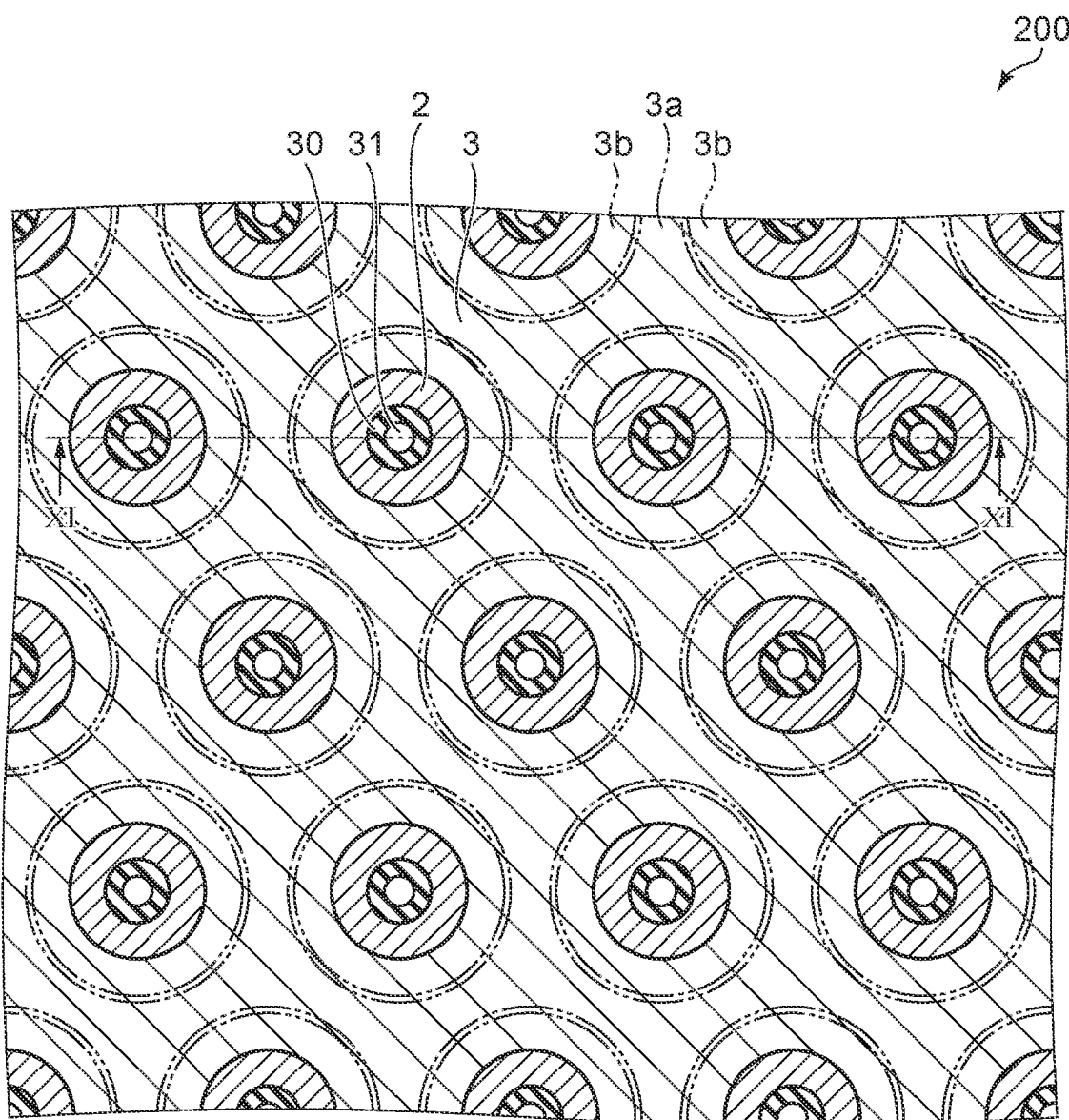
FIG. 13 is a cross-sectional view illustrating a semiconductor device according to the second embodiment.

FIGS. 11 and 13 are cross-sectional views illustrating a semiconductor device according to the second embodiment.

Figure 12:
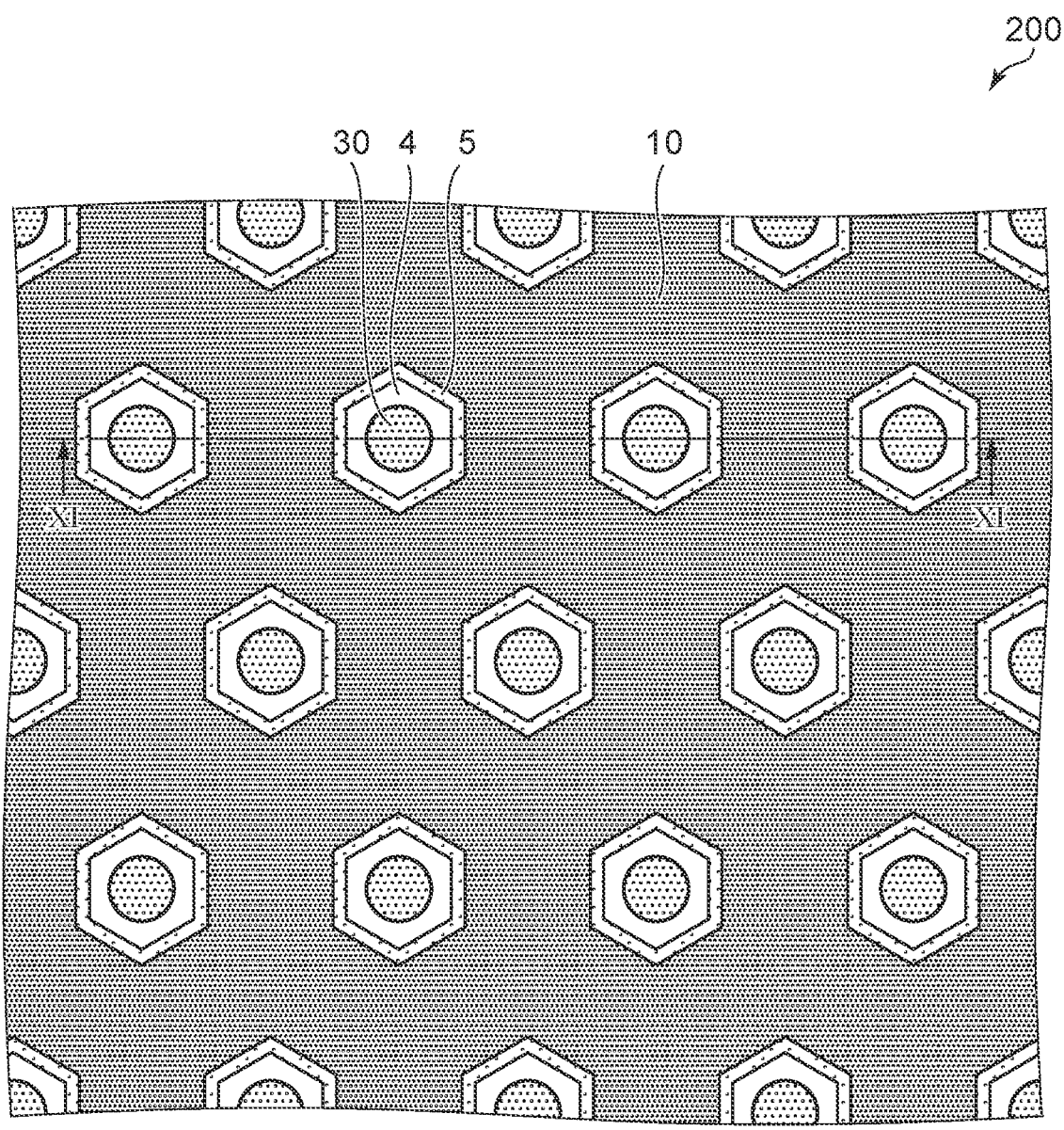
FIG. 12 is a plan view illustrating a semiconductor device according to the second embodiment.

FIG. 12 is a plan view illustrating a semiconductor device according to the second embodiment.

FIG. 11 is a cross-sectional view taken along the line XI-XI in FIGS. 12 and 13. FIG. 13 is a cross-sectional view taken along the line XIII-XIII in FIG. 11. In FIG. 12, the insulating layer 12 and the source electrode 22 are omitted.

In a semiconductor device 200 according to the second embodiment, a plurality of p⁻-type pillar regions 2 are provided in X-direction and Y-direction as illustrated in FIG. 13. For example, Y-direction is not perpendicular to X-direction, and inclined with respect to X-direction.

As illustrated in FIGS. 11 and 13, the n⁻-type pillar region 3 is provided around a plurality of p⁻-type pillar regions 2 in X-Y plane. The n⁻-type pillar region 3 includes the first region 3a and a plurality of the second regions 3b. The plurality of second regions 3b are respectively provided between the plurality of p⁻-type pillar regions 2 and the first region 3a. The plurality of second regions 3b are respectively provided around the plurality of p⁻-type pillar regions 2 in X-Y plane.

As illustrated in FIGS. 11 and 12, the p-type base region 4 is provided on each p⁻-type pillar region 2. One p-type base region 4 is provided around the upper portion of the insulating part in the X-Y plane. The n⁺-type source region 5 is provided on each p-type base region 4. The gate electrode 10 is provided on the n⁻-type pillar region 3 and the plurality of p-type base regions 4 with the gate insulating layer 11 interposed therebetween such that the plurality of p-type base regions 4 and the plurality of n⁻-type source regions 5 are exposed to the source electrode 22.

According to the second embodiment, the area of the n⁻-type pillar region 3 in X-Y plane can be increased compared to the first embodiment. The width of the path of electrons can be increased when the semiconductor device 200 is in an on-state. Thereby, the on-resistance of the semiconductor device 200 can be reduced.

Further, in the semiconductor device 200, as in the semiconductor device 100, the n⁻-type pillar region 3 includes the first region 3a and the second region 3b. Thereby, variation in the breakdown voltage of the semiconductor device 200 can be reduced, thus improving the reliability of the semiconductor device 200. Further, the n⁻-type buffer region 6 includes the first portion 6a and the second portion 6b. Thereby, the breakdown voltage of the semiconductor device 200 can be improved.

The configuration of the n⁻-type pillar region 3 is particularly suitable for the semiconductor device 200 according to the second embodiment. In a case where a plurality of p⁻-type pillar regions 2 are provided in two directions, a portion which is far from any of the p⁻-type pillar regions 2 and which is difficult to deplete is generated in the n⁻-type pillar region 3. In a case where the n⁻-type pillar region 3 includes the first region 3a, the portion which is difficult to deplete is positioned in the first region 3a. Therefore, the portion is easily depleted compared to a case where the n-type impurity concentration in the n⁻-type pillar region 3 is uniform.

More specifically, description will be given with reference to FIG. 14.

Figure 14:
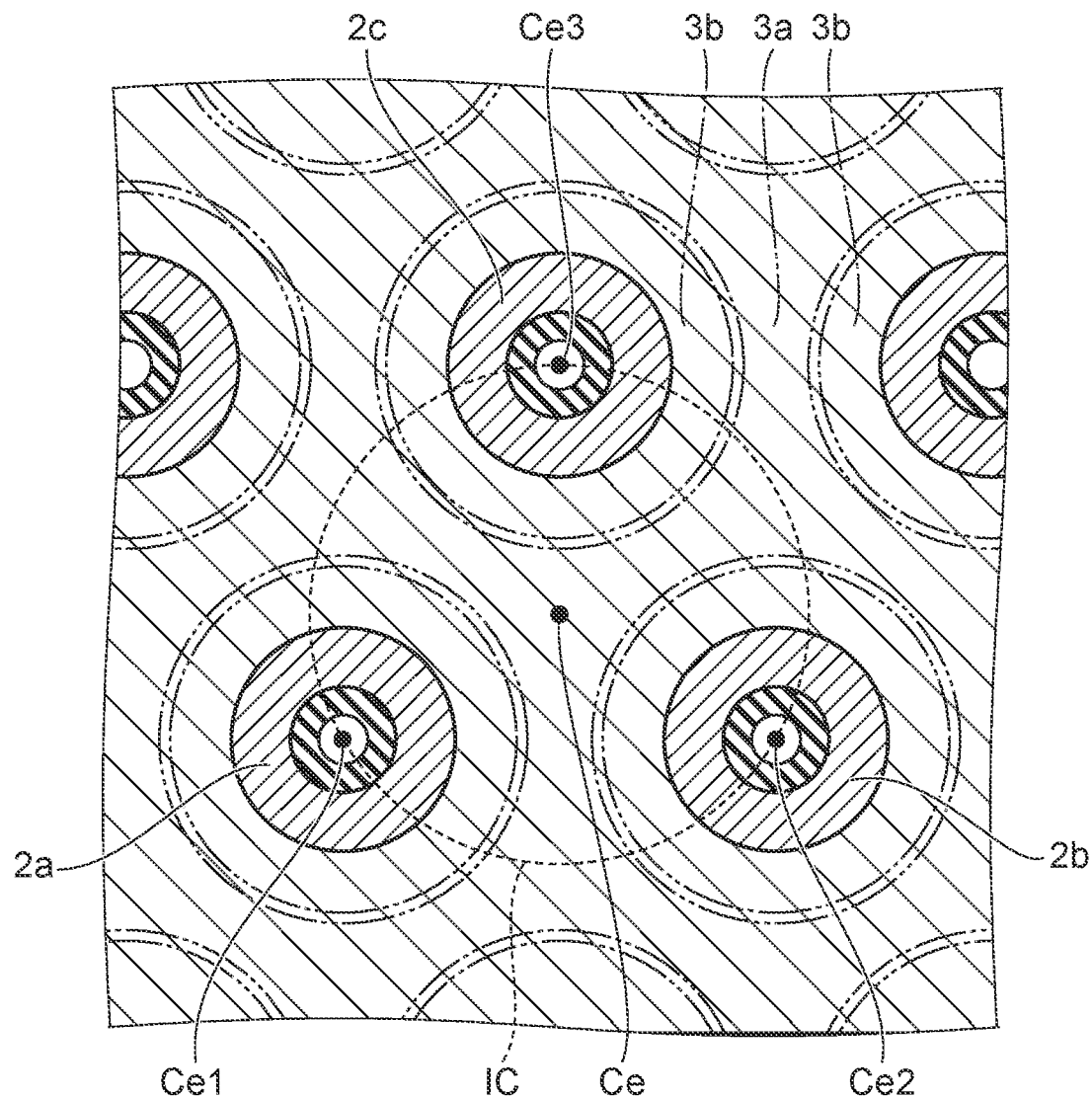
FIG. 14 is a cross-sectional view enlarging a portion of FIG. 13.

FIG. 14 is a cross-sectional view enlarging a portion of FIG. 13.

For example, a plurality of p⁻-type pillar regions 2 include a first p⁻-type pillar region 2a, a second p⁻-type pillar region 2b, and a third p⁻-type pillar region 2c. The second p⁻-type pillar region 2b is adjacent to the first p⁻-type pillar region 2a in X-direction. The third p⁻-type pillar region 2c is adjacent to the first p⁻-type pillar region 2a in Y-direction.

An imaginary circle IC passing through the center Ce1 of the first p⁻-type pillar region 2a in X-direction and Y-direction, the center Ce1 of the second p⁻-type pillar region 2b in X-direction and Y-direction, and the center Ce3 of the third p⁻-type pillar region 2c in X-direction and Y-direction is assumed. At this time, the center Ce of the imaginary circle IC is positioned separated from any of the first p⁻-type pillar region 2a, the second p⁻-type pillar region 2b, and the third p⁻-type pillar region 2c. A depletion layer extending from each p⁻-type pillar region 2 is less likely to reach the n⁻-type pillar region 3 around the center Ce.

As a method for depleting a portion around the center Ce, there is a method of reducing the interval between the p⁻-type pillar regions 2. In this case, the area of the n⁻-type pillar region 3 in X-Y plane is small. As a result, the on-resistance of the semiconductor device 200 increases. As another method, there is a method of reducing the n-type impurity concentration in the n⁻-type pillar region 3. Also in this case, the electrical resistance in the n⁻-type pillar region 3 increases, as a result of which the on-resistance of the semiconductor device 200 increases.

By reducing the n-type impurity concentration of the first region 3a including a portion around the center Ce relative to the second region 3b, the portion around the center Ce is easily depleted. Thus, according to the second embodiment, the breakdown voltage of the semiconductor device 200 can be improved while increase in the on-resistance of the semiconductor device 200 is suppressed.

Examples in which Y-direction is inclined with respect to X-direction have been described herein, but Y-direction may be perpendicular to X-direction. Further, in the examples illustrated, the shape of the p⁻-type pillar region 2 viewed from Z-direction is a circular shape. The shape of the p⁻-type pillar region 2 viewed from Z-direction may be a polygonal shape (for example, a regularly hexagonal shape).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A method for manufacturing a semiconductor device, comprising:
    forming a first diffusion region of a first conductivity type by doping an inner surface of an opening of a structural body with a first conductivity type impurity using plasma doping or solid phase diffusion, wherein:
    the structural body includes:
        a first semiconductor layer of the first conductivity type, and
        a second semiconductor layer of the first conductivity type provided on the first semiconductor layer of the first conductivity type, an impurity concentration of the first conductivity type in the second semiconductor layer of the first conductivity type being lower than an impurity concentration of the first conductivity type in the first semiconductor layer of the first conductivity type, the opening being formed on an upper surface of the second semiconductor layer of the first conductivity type, and
    the first diffusion region of the first conductivity type includes;
        a first region separated from the inner surface of the opening of the structural body in a second direction perpendicular to a first direction, the first direction being from the first semiconductor layer of the first conductivity type to the second semiconductor layer of the first conductivity type, and
        a second region positioned between the inner surface of the opening of the structural body and the first region, an impurity concentration of the first conductivity type in the second region being higher than an impurity concentration of the first conductivity type in the first region.

2. The method according to claim 1, wherein the first diffusion region includes a third region positioned between the first semiconductor layer of the first conductivity type and the inner surface of the opening of the structural body in the first direction.

3. The method according to claim 1, wherein the impurity concentration of the first conductivity type in the first region is less than 0.5 times the impurity concentration of the first conductivity type impurity in the second region.

4. The method according to claim 1, further comprising forming a second diffusion region of a second conductivity type along the inner surface,
    the second diffusion region of the second conductivity type being formed by doping a second conductivity type impurity along the inner surface of the opening of the structural body using plasma doping or solid phase diffusion.

5. The method according to claim 4, further comprising:
    forming a first insulating layer in the opening, and
    forming a third diffusion region of the second conductivity type by ion-implantation on an upper portion of the second semiconductor layer of the first conductivity type.

6. The method according to claim 5, wherein the first insulating layer includes a gap.

7. The method according to claim 5, further comprising:
    forming a gate electrode on the third diffusion region of the second conductivity type with interposed a second insulating layer therebetween, and
    forming a fourth diffusion region of the first conductivity type by ion-implantation on an upper portion of the third diffusion region.

8. The method according to claim 7, further comprising:
    forming an electrode contacting the third diffusion region of the second conductivity type and the fourth diffusion region of the first conductivity type, and
    forming another electrode contacting the first semiconductor layer.

9. The method according to claim 4, wherein a length of the first diffusion region of the first conductivity type in the second direction is longer than a length of the second diffusion region of the second conductivity type in the second direction.

10. The method according to claim 4, wherein:
the first region is separated from the second diffusion region of the second conductivity type in the second direction and a third direction,
the third direction is perpendicular to the first direction and intersects the second direction, and
the second region is provided between the second diffusion region and the first region in the second direction and the third direction.

11. The method according to claim 1, wherein:
a plurality of openings is formed on the upper surface of the second semiconductor layer of the first conductivity type,
a length of one of the plurality of openings in a third direction is longer than a length of the one of the plurality of openings in the second direction, and
the third direction is perpendicular to the first direction and intersects the second direction.

12. The method according to claim 1, wherein:
a plurality of openings is formed on the upper surface of the second semiconductor layer of the first conductivity type,
the plurality of openings arrayed in the second direction and a third direction, and
the third direction is perpendicular to the first direction and intersects the second direction.

* * * * *